(12) United States Patent
Gerowitz et al.

(10) Patent No.: US 8,136,059 B2
(45) Date of Patent: Mar. 13, 2012

(54) INDETERMINATE STATE LOGIC INSERTION

(75) Inventors: Robert Glen Gerowitz, Raleigh, NC (US); Michael Patrick Muhlada, Raleigh, NC (US); Chad Everett Winemiller, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 12/257,610

(22) Filed: Oct. 24, 2008

(65) Prior Publication Data

US 2010/0107129 A1    Apr. 29, 2010

(51) Int. Cl.
*G06F 17/50* (2006.01)

(52) U.S. Cl. ........................................ 716/100; 716/101

(58) Field of Classification Search ........... 716/100–104
See application file for complete search history.

(56) References Cited

U.S. PATENT DOCUMENTS

| | | | |
|---|---|---|---|
| 6,311,317 B1 | 10/2001 | Khoche et al. | |
| 7,020,854 B2 * | 3/2006 | Killian et al. | 716/102 |
| 7,127,691 B2 | 10/2006 | Cruz et al. | |
| 7,174,530 B2 * | 2/2007 | Yamada | 716/104 |
| 7,318,213 B2 * | 1/2008 | Nishi | 716/103 |
| 7,353,491 B2 * | 4/2008 | Gutberlet et al. | 716/104 |
| 2002/0162087 A1 * | 10/2002 | Minami et al. | 716/18 |
| 2004/0034815 A1 | 2/2004 | Yamada | |
| 2005/0229123 A1 | 10/2005 | Wand et al. | |
| 2005/0273752 A1 * | 12/2005 | Gutberlet et al. | 716/18 |
| 2007/0168803 A1 | 7/2007 | Wang et al. | |

FOREIGN PATENT DOCUMENTS

JP    2004102703    2/2004

\* cited by examiner

*Primary Examiner* — Jack Chiang
*Assistant Examiner* — Binh Tat
(74) *Attorney, Agent, or Firm* — Yee & Associates, P.C.; Daniel H. Schnurmann

(57) ABSTRACT

Illustrative embodiments provide a computer-implemented method for resolving indeterminate states by inserting logic into a design. The computer-implemented method receives an original design input from a requester to form a received input and determines whether the received input contains an indeterminate output. Responsive to a determination that the received input contains an indeterminate output, the computer-implemented method generates a temporary design from the received input, wherein the temporary design contains "unique" output and all inputs, updates the temporary design, and synthesizes the original design and each temporary design individually to form a synthesized original design and a set of synthesized temporary designs. The computer-implemented method merges the synthesized original design with the set of synthesized temporary design to form a final design; and returns the final design to the requester.

14 Claims, 5 Drawing Sheets

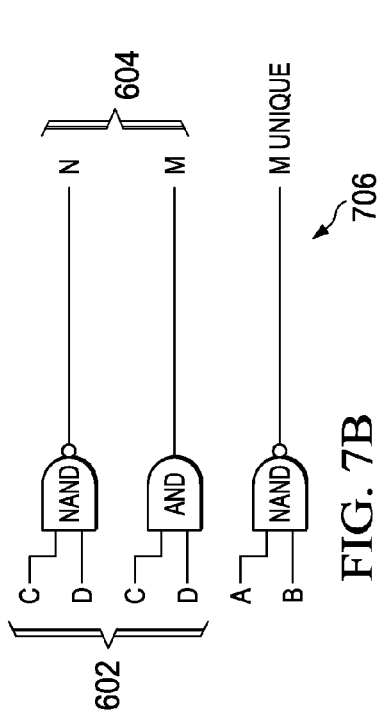
FIG. 7B
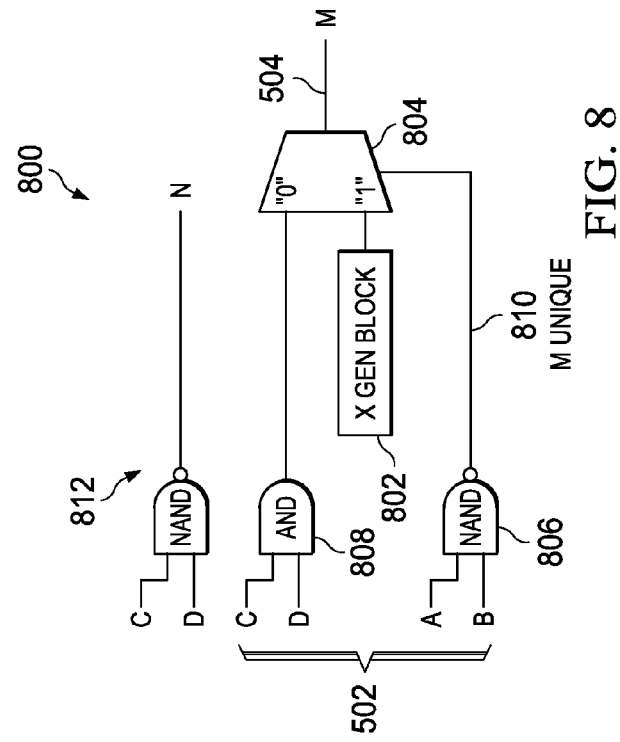
FIG. 8
FIG. 7A

INDETERMINATE STATE LOGIC INSERTION

BACKGROUND OF THE INVENTION

1. Field of the Invention

The present disclosure relates generally to an improved data processing system and, more specifically, to a computer-implemented method, a data processing system, and a computer program product for resolving indeterminate states by inserting logic into a design.

2. Description of the Related Art

Typically, various types of computer aided design (CAD) rules need to be created manually, which is very time-consuming and difficult to maintain as designs evolve. In particular, computer aided design rules that have indeterminate outputs, as required by some manufacturing test rules; do not lend themselves to generation by current synthesis tools.

Synthesis tools can be used to create and add test points to existing designs in order to improve the ability to test the designs. In another usage, test generation tools may be used in conjunction with a design simulator to develop additional logic associated with the design. The additional logic further enhances the test coverage for the design by adding or further specifying conditional parameters to existing test logic. For example, additional logic is provided to test functional attributes not available in a previous test cycle. In another example, added logic tests a combination of features not combined before, such as new function recently included with old base code.

The current tools work with content that has been defined previously to supplement a design that exists. Current tools cannot handle ambiguous state conditions and therefore require the input data to be determinate. The tools do not function when data provided produces design output of an indeterminate nature. Therefore, when a design or portion of a design produces indeterminate results, current synthesis tools cannot be used.

BRIEF SUMMARY OF THE INVENTION

According to one illustrative embodiment, a computer-implemented method for resolving indeterminate states by inserting logic into a design is provided. The computer-implemented method receives an original design input from a requester to form a received input and determines whether the received input contains an indeterminate output. Responsive to a determination that the received input contains an indeterminate output, the computer-implemented method generates a temporary design from the received input, wherein the temporary design contains "unique" output and all inputs, updates the temporary design, and synthesizes the original design and each temporary design individually to form a synthesized original design and a set of synthesized temporary designs. The computer-implemented method merges the synthesized original design with the set of synthesized temporary designs to form a final design, and returns the final design to the requestor.

In another illustrative embodiment, a data processing system is present for resolving indeterminate states by inserting logic into a design. The data processing system comprises a bus, a memory connected to the bus, the memory containing computer-executable instructions and a processor unit connected to the bus. The processor unit executes the computer-executable instructions to direct the data processing system to receive an original design input from a requester to form a received input, determine whether the received input contains an indeterminate output, and responsive to a determination that the received input contains an indeterminate output, generates a temporary design from the received input, wherein the temporary design contains "unique" output and all inputs. The data processing system is further directed to update the temporary design, synthesize the original design and each temporary design individually to form a synthesized original design and a set of synthesized temporary designs, merge the synthesized original design with the set of synthesized temporary designs to form a final design, and return the final design to the requestor.

In yet another illustrative embodiment a computer program product is present for resolving indeterminate states by inserting logic into a design. The computer program product comprises a computer-readable medium having computer-executable instructions stored thereon, the computer-executable instructions comprising, computer-executable instructions for receiving an original design input from a requester to form a received input, computer-executable instructions for determining whether the received input contains an indeterminate output, computer-executable instructions responsive to a determination that the received input contains an indeterminate output, for generating a temporary design from the received input, wherein the temporary design contains "unique" output and all inputs, computer-executable instructions for updating the temporary design, computer-executable instructions for synthesizing the original design and each temporary design individually to form a synthesized original design and a set of synthesized temporary designs, computer-executable instructions for merging the synthesized original design with the set of synthesized temporary designs to form a final design, and computer-executable instructions for returning the final design to the requestor.

BRIEF DESCRIPTION OF THE SEVERAL VIEWS OF THE DRAWINGS

FIG. 7A is a block diagram of a temporary design state table with determinate output states and FIG. 7B is a block diagram of the temporary design with determinate and indeterminate output states to be handled, in accordance with illustrative embodiments;

FIG. 8 is a block diagram of a logic design, in accordance with illustrative embodiments.

DETAILED DESCRIPTION OF THE INVENTION

Figure 1:
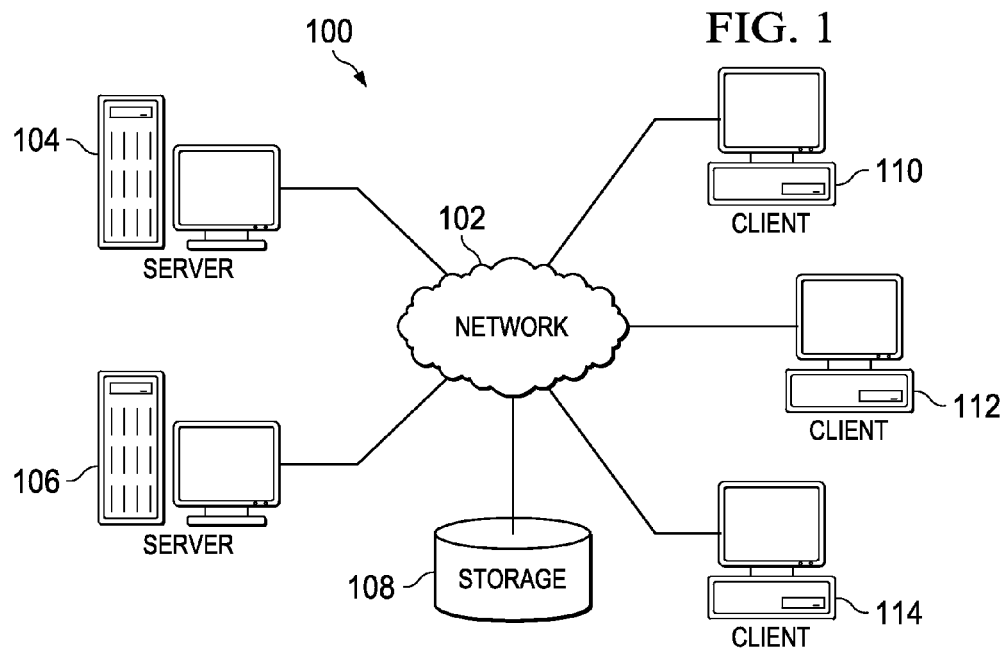
FIG. 1 depicts a pictorial representation of a network of data processing systems, in which illustrative embodiments may be implemented.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer-usable or computer-readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by, or in connection with, the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to wireless, wire line, optical fiber cable, RF, etc.

Computer program code for carrying out operations of the present invention may be written in any combination of one or more programming languages, including an object-oriented programming language such as Java, Smalltalk, C++ or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems), and computer program products, according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer, or other programmable data processing apparatus, create means for implementing the functions/acts specified in the flowchart and/or block diagram block or blocks. These computer program instructions may also be stored in a computer-readable medium that can direct a computer, or other programmable data processing apparatus, to function in a particular manner, such that the instructions stored in the computer-readable medium produce an article of manufacture including instruction means, which implement the function/act specified in the flowchart and/or block diagram block or blocks.

The computer program instructions may also be loaded onto a computer, or other programmable data processing apparatus, to cause a series of operational steps to be performed on the computer, or other programmable apparatus, to produce a computer-implemented process such that the instructions which execute on the computer, or other programmable apparatus, provide processes for implementing the functions/acts specified in the flowchart and/or block diagram block or blocks.

Figure 2:
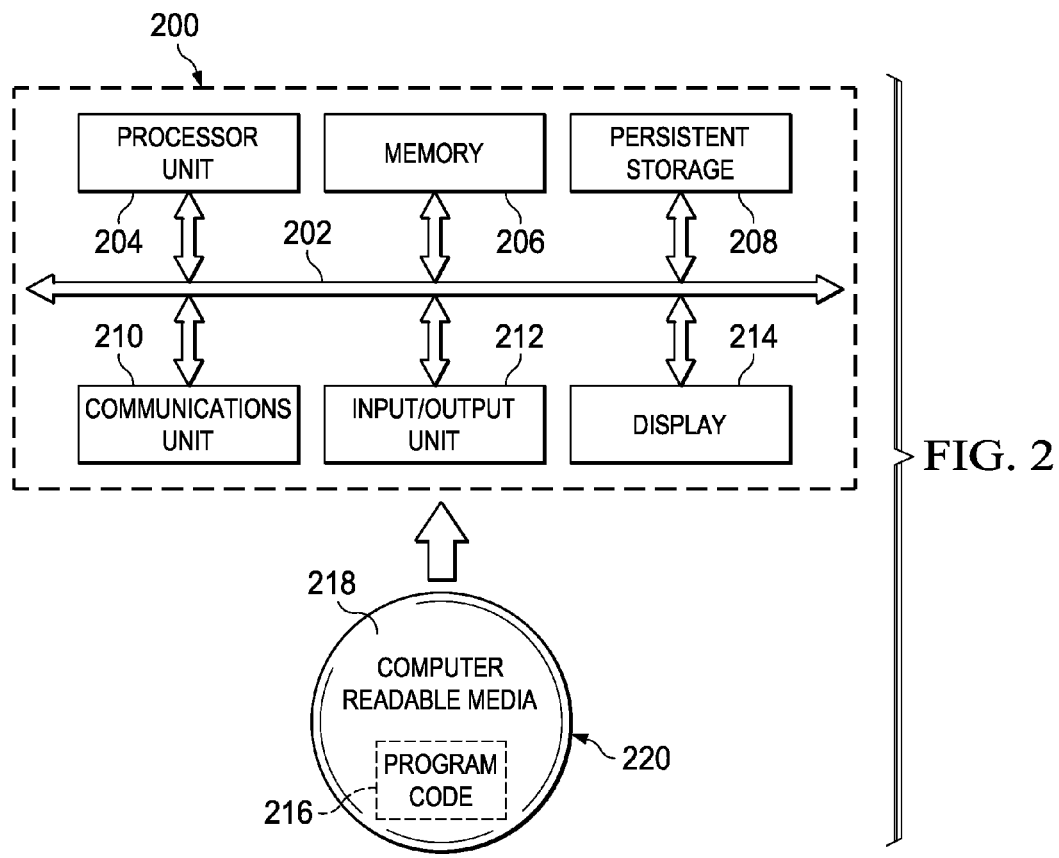
FIG. 2 is a block diagram of a data processing system, in which illustrative embodiments may be implemented.

With reference now to the figures, and in particular with reference to FIGS. 1 and 2, exemplary diagrams of data processing environments are provided in which illustrative embodiments may be implemented. It should be appreciated that FIGS. 1 and 2 are only exemplary and are not intended to assert or imply any limitation with regard to the environments in which different embodiments may be implemented. Many modifications to the depicted environments may be made.

FIG. 1 depicts a pictorial representation of a network of data processing systems, in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102, along with storage unit 108. In addition, clients 110, 112, and 114 connect to network 102. Clients 110, 112, and 114 may be, for example, personal computers or network computers. In the depicted example, server 104 provides data, such as boot files, operating system images, and applications, to clients 110, 112, and 114. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational, and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

Using the example of system 100 of FIG. 1, client 110 or client 112 provides a source design input containing a set of input values and a set of expected output values through network 102 to a rule builder on server 104. The rule builder determines when the source input contains indeterminate outputs. Responsive to a determination that the source contains indeterminate outputs, a temporary design is created for each indeterminate output. The temporary design is a design that is created only for the purpose of resolving and/or allowing the processing of indeterminate output results. The temporary design exists only during the processing of the original design. The temporary design contains intermediate determinate output values that replace the indeterminate output values. Rules logic is then created from synthesizing each of the temporary designs and the original design individually. All synthesized temporary designs are combined or merged with the original design input located on server 104 to produce a final design. The result is made available to client 110 and client 112 from server 104, through network 102.

With reference now to FIG. 2, a block diagram of a data processing system is shown, in which illustrative embodiments may be implemented. Data processing system 200 is an example of a computer, such as server 104 or client 110 in FIG. 1, in which computer-usable program code or instructions implementing the processes may be located for the illustrative embodiments. In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors, or may be a multi-processor core, depending on the particular implementation. Further, processor unit 204 may be implemented using one or more heterogeneous processor systems in which a main processor is present, with secondary processors on a single chip. As another illustrative example, processor unit 204 may be a symmetric multi-processor system containing multiple processors of the same type.

Memory 206 and persistent storage 208 are examples of storage devices. A storage device is any piece of hardware that is capable of storing information, either on a temporary basis and/or a permanent basis. Memory 206, in these examples, may be, for example, a random access memory or any other suitable volatile or non-volatile storage device. Persistent storage 208 may take various forms, depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer-implemented instructions, which may be located in a memory, such as memory 206. These instructions are referred to as program code, computer-usable program code, or computer-readable program code that may be read and executed by a processor in processor unit 204. The program code in the different embodiments may be embodied on different physical or tangible computer-readable media, such as memory 206 or persistent storage 208.

Program code 216 is located in a functional form on computer-readable media 218 that is selectively removable, and may be loaded onto, or transferred to, data processing system 200 for execution by processor unit 204. Program code 216 and computer-readable media 218 form computer program product 220 in these examples. In one example, computer-readable media 218 may be in a tangible form, such as, for example, an optical or magnetic disc that is inserted or placed into a drive, or other device, that is part of persistent storage 208 for transfer onto a storage device, such as a hard drive that is part of persistent storage 208. In a tangible form, computer-readable media 218 also may take the form of a persistent storage, such as a hard drive, a thumb drive, or a flash memory that is connected to data processing system 200. The tangible form of computer-readable media 218 is also referred to as computer-recordable storage media. In some instances, computer-readable media 218 may not be removable.

Alternatively, program code 216 may be transferred to data processing system 200 from computer-readable media 218 through a communications link to communications unit 210 and/or through a connection to input/output unit 212. The communications link and/or the connection may be physical or wireless in the illustrative examples. The computer-readable media also may take the form of non-tangible media, such as communications links or wireless transmissions, containing the program code.

The different components illustrated for data processing system 200 are not meant to provide architectural limitations to the manner in which different embodiments may be implemented. The different illustrative embodiments may be implemented in a data processing system, including components in addition to, or in place of, those illustrated for data processing system 200. Other components shown in FIG. 2 can be varied from the illustrative examples shown.

As one example, a storage device in data processing system 200 is any hardware apparatus that may store data. Memory 206, persistent storage 208, and computer-readable media 218 are examples of storage devices in a tangible form.

In another example, a bus system may be used to implement communications fabric 202, and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206 or a cache, such as found in an interface and memory controller hub that may be present in communications fabric 202.

Figure 3:
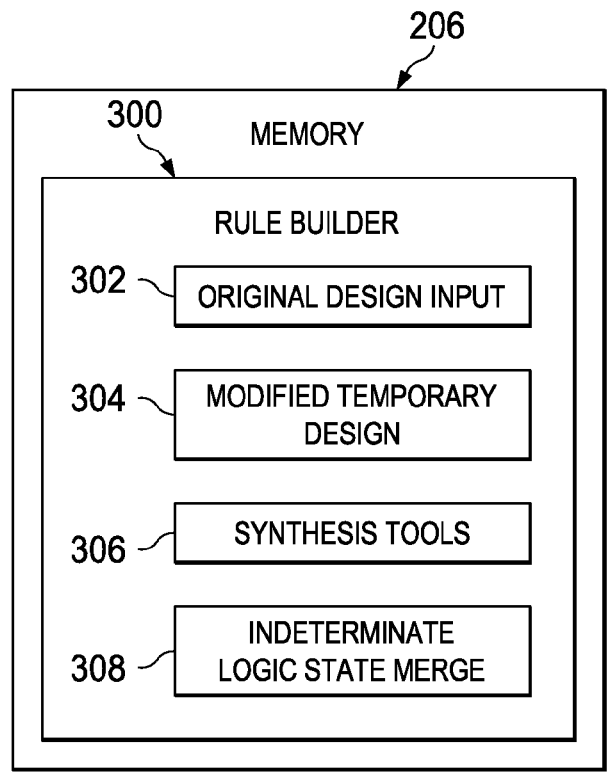
FIG. 3 is a block diagram of components of a rule builder, in accordance with illustrative embodiments.

With reference to FIG. 3, a block diagram of components of a rule builder, in accordance with illustrative embodiments, is shown. In the example of a rule generator, rule builder 300, is shown within memory 206 of system 200 of FIG. 2. A number of components are included in rule builder 300 comprising a data structure containing original design input 302, modified design synthesized states 304, synthesis tools 306, and indeterminate logic state merge 308. The components, when combined as a whole, interact together as needed to produce a modified design that provides a solution for inputs which provide indeterminate outputs.

Original design input 302 is an initial input that provides the source-level subject matter that defines the design. The source level subject matter of the original design is typically provided as a set of software parameters and attributes that describe the required inputs and outputs. For example, an original design for a switch specifies the input values that may be voltage, output values of a similar voltage and conditions in which switching occur, such as when a specified voltage is applied to an input terminal, causing a reaction on an output terminal. In some cases, the set of output values are indeterminate for a predefined set of inputs.

Modified design synthesized states 304 represents the intermediate form of original design input 302. The modification occurred as a result of applying replacement values having determinate values to the indeterminate terms of the design. For example, a column having indeterminate values has the column replaced with a corresponding set of determinate values, in accordance with illustrative embodiments. The intermediate form is a temporary structure used in further processing to arrive at a final design.

Synthesis tools 306 provides a conventional set of tools for synthesizing logic from a predefined source input, such as original design input 302. Synthesis tools 306 are generally available for such tasks.

Indeterminate logic state merge 308 combines the original determinate synthesized logic portion of 302 with modified design synthesized states 304 by adding logic (for example, multiplexors) as necessary, to create the final rule. Indeterminate logic state merge 308 combines each of the synthesized temporary files into a single design representing all possible states the design may produce. This is accomplished by adding logic as necessary, while maintaining the original design intent.

Figure 4:
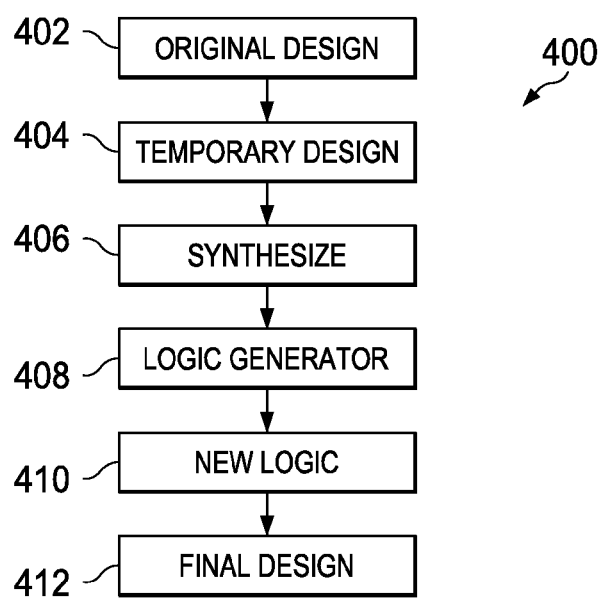
FIG. 4 is a block diagram of an overview of a process flow using the rule builder of FIG. 3, in accordance with illustrative embodiments.

With reference to FIG. 4, a block diagram of an overview of a process flow using the rule builder of FIG. 3 is shown, in accordance with illustrative embodiments. Process 400 depicts in an example, an overview of the rule-building process using rule builder 300 of FIG. 3.

Original design 402 is obtained as input into the process to create a temporary, intermediate design 404. A set of temporary designs is created to accommodate the addition of "unique" outputs and all inputs. A temporary design may be created for each instance of a "unique" output, thereby creating a set of temporary intermediate designs. Updating of the temporary design comprises indicating a first predetermined response value for all input combinations where an indeterminate value is measured on original output, and indicating a second predetermined response value for all input combinations where a determinate value is measured on original output.

Temporary design 404 provides a synthesizable determinate version of intermediate outputs for each instance of an indeterminate output defined in original design 402 source input. The temporary, intermediate design has a new output pin with a unique name for each output, which drives an "X" value denoting an indeterminate output of the original design. Each temporary design resolves one indeterminate output value. Each of the temporary design files and the original design are then used as input to synthesize 406. Synthesize 406 applies synthesis tools to the temporary designs and the original design to generate synthesized logic output. Synthesize is a process in which the design statements are transformed into another format closer to the target environment. For example, in computer aided design the synthesizing process transforms the input specifications into a hardware model specification. Synthesize tools can be used because the indeterminate outputs have all been now re-specified as determinate output values. For example, the synthesized output is the definitions created to specify the addition of a branch in a previously defined switch resulting in new combinations of input and output values.

Logic generator 408 creates the new logic from the set of synthesized temporary designs and original design in the form of new or changed rules that comprise a set of new logic 410. New logic 410 is then merged to produce a final design output comprising a result set of rules and design. Merging is a process of combining the design files associated with the original design. For example, when three temporary design files are generated to resolve indeterminate outputs of an original design the result is four design files to be merged into one final design. Each of the temporary design files addressed only one instance of indeterminate output of the original design. The combination of the temporary and original designs provides a complete solution to the indeterminate output problems presented. Final design and determinate rules 412 is the output of process 400. Final design and determinate rules 412 provides a determinate implementation of the original design while still preserving the indeterminate outputs.

Figure 5:
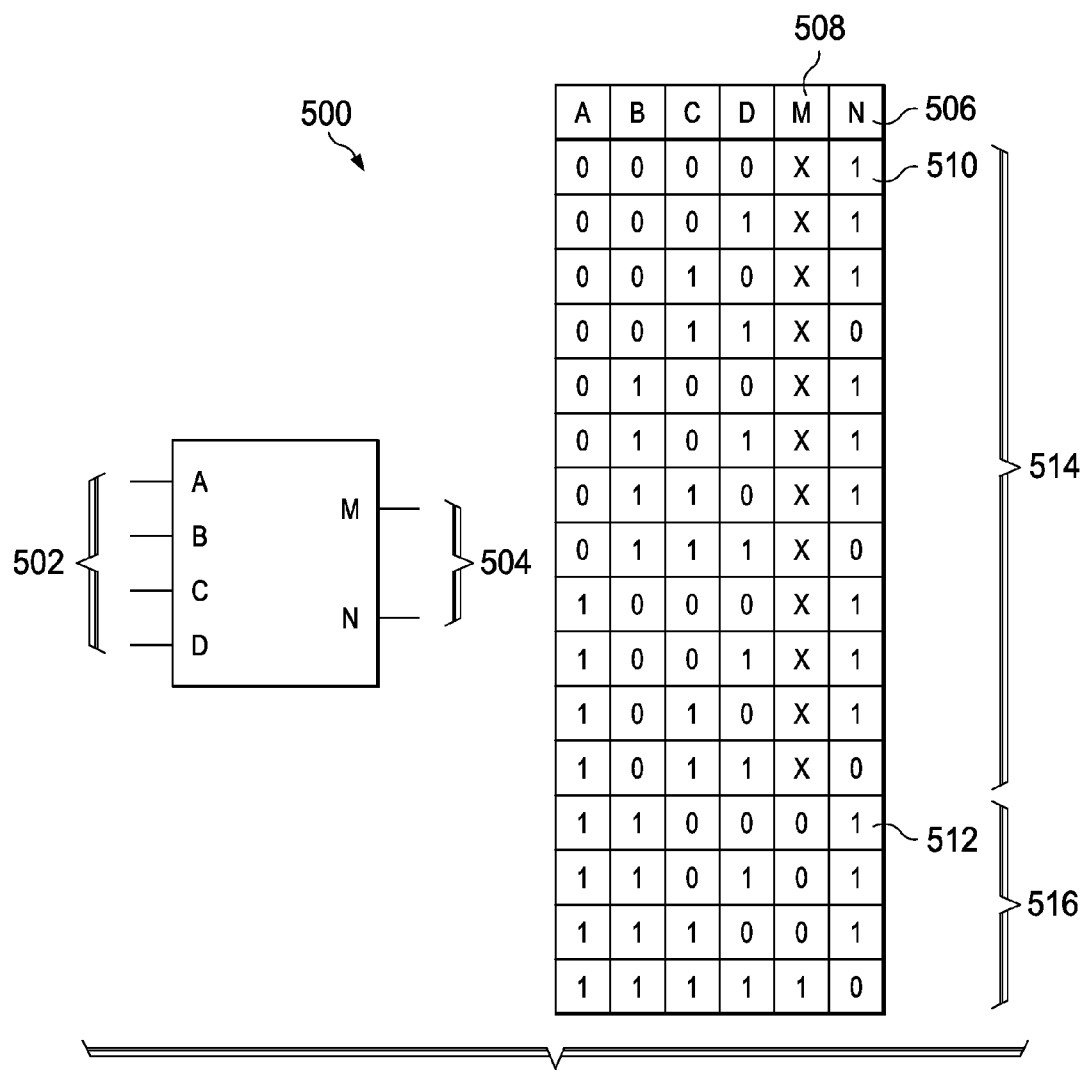
FIG. 5 is a block diagram of an original design state table with indeterminate output states to be handled, in accordance with illustrative embodiments.

With reference to FIG. 5, a block diagram of an original design state table with indeterminate output states to be handled, in accordance with illustrative embodiments, is shown. Original design 500 is depicted showing a set of inputs with a corresponding set of outputs, and a truth table representing the various states or conditions of interest. Set of inputs 502 provides the source inputs of the design while set of outputs 504 represents the result set of outputs.

Truth table 506 defines a header row in which column 508 defines an output variable "M." As seen in the table, row 510 indicates a value of "X" in column 508. The value of "X" indicates an indeterminate output result for the set of inputs in the corresponding row. Row 512 indicates a value of "0" in column 508 denoting a determinate value for the cell. Set of values 514 defines a set of values in column 508 that are indeterminate. There is no defined absolute value in the cells of set of values 514. In contrast, set of values 516 defines a set of values comprising "0" and "1," indicating an absolute value for each cell.

Figure 6:
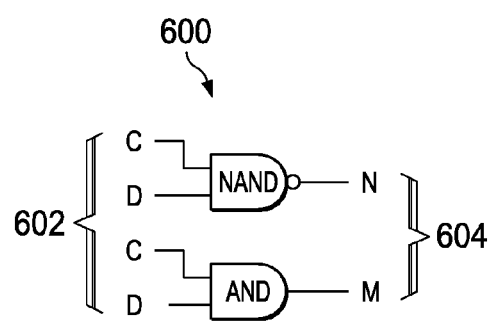
FIG. 6 is a block diagram of synthesized logic without indeterminate output states, in accordance with illustrative embodiments.

With reference to FIG. 6, a block diagram of synthesized logic without indeterminate output states, in accordance with illustrative embodiments, is shown. Logic set 600 illustrates a result of applying a set of logic definitions to source inputs 502 of FIG. 5. For set of inputs 602, a resulting set of outputs 604 is defined. The example shows the result of applying standard synthesis tools to the inputs and ignoring the indeterminate results from inputs A and B of input 502 of FIG. 5. The results are thus incomplete due to the lack of consideration for the indeterminate values. Inputs A and B have no effect on the output M when disregarding indeterminate output states 514 of FIG. 5. If indeterminate outputs are to be represented, the effect of inputs A and B of logic set 502 would have to be modeled in this logic.

With reference to FIG. 7A, is a block diagram of a temporary design state table with determinate output states, in accordance with illustrative embodiments, is shown. The example table differs from truth table 506 of FIG. 5 in that table 700 has additional column 702.

Column 702 defines a replacement of each "X" value of column 508 of FIG. 5 with a "1" value. Each cell of column 508 containing a value other than "X" has a corresponding cell in column 702 containing a "0" value. The set of values 514 of FIG. 5 now has a corresponding set of values of "1" in each cell of column 702. Similarly, column 702 contains a "0" in each cell of set of values 516.

Truth table 700 defines the modified truth table of FIG. 5 in which column 702 defines determinate values for the intermediate output (for example, "M unique") in the temporary design file rather than indeterminate values on the real output 508. The original design has thus been modified with the inclusion of the column of determinate values.

With reference to FIG. 7B, a block diagram of a temporary design with indeterminate and determinate output states to be handled is shown. The figure shows content similar to that of FIG. 6, but with the addition of logic block 706. Logic block 706 depicts the addition of the now determinate output of "M unique" for the pair of inputs A and B.

With reference to FIG. 8, a block diagram of a logic design, in accordance with illustrative embodiments, is shown. Logic 800 depicts a relationship for set of inputs 502 to produce subset of outputs 504 of FIG. 5. Logic block 806 provides the synthesized determinate input of "M unique" 810 to selector 804 resulting in output 504 of FIG. 5, for variable "M." Logic block 808 provides original input to the "0" connector of selector 804. Logic block 812 provides original input to produce determinate output "N."

The indeterminate state values have been resolved to determinate state values in modified truth table 700 of FIG. 7A. Determinate values of "M unique" in column 702 provide input to selector 804 in order to select between the determinate values for output "M" and the indeterminate values for output "M" (generated by X Gen Block 802) from column 508 of FIG. 5.

Figure 9:
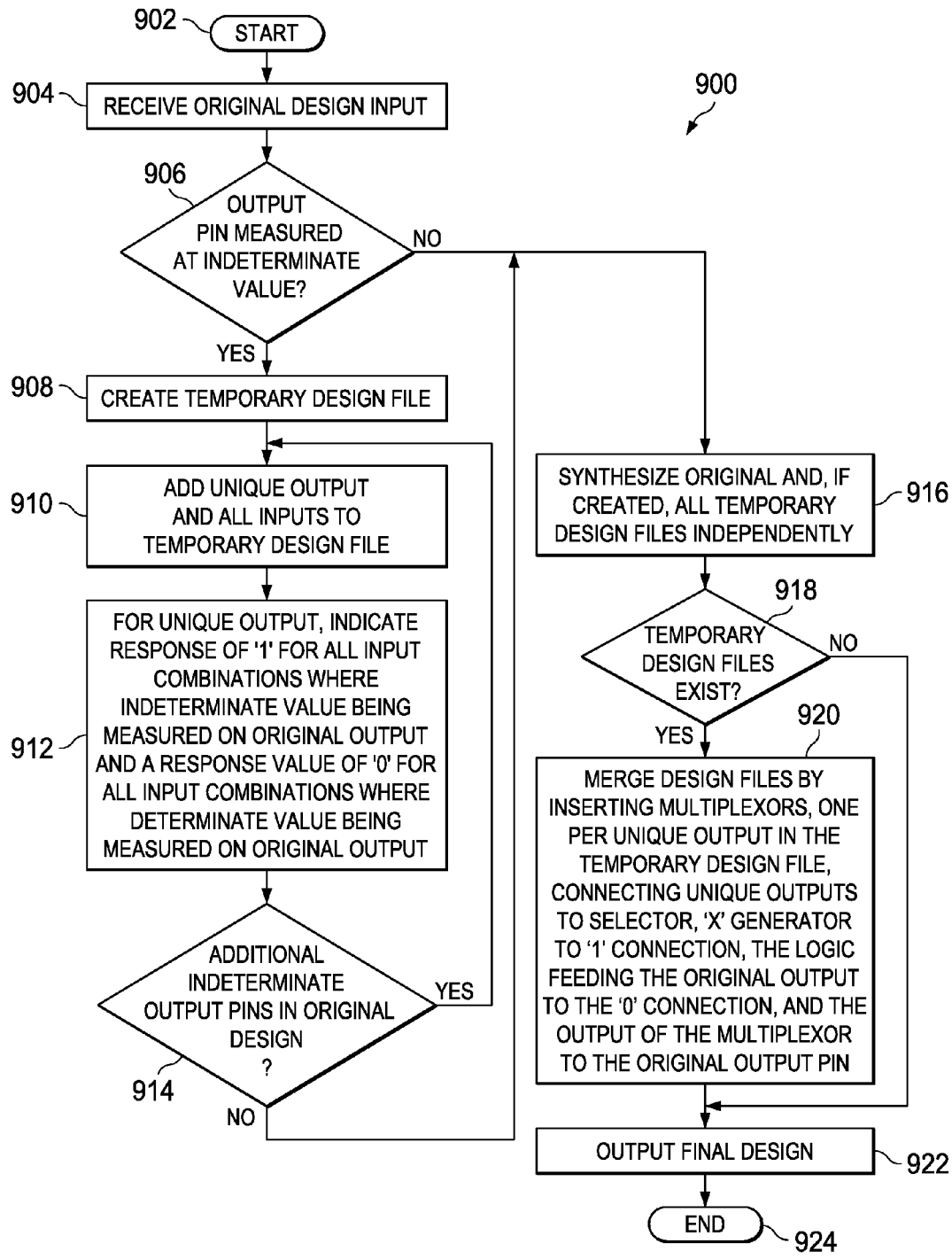
FIG. 9 is a flowchart of a process using the rule builder of FIG. 3, in accordance with illustrative embodiments.

With reference to FIG. 9, a flowchart of a process using the rule builder of FIG. 3, in accordance with illustrative embodiments, is shown. Process 900 is an example of use of rule builder 300 of FIG. 3.

Process 900 begins (step 902) and receives a source input as an original design input (step 904). The source input of the original design may be in a variety of forms, as suited to the process environment. The original design input is examined to determine whether an indeterminate output exists within the design. Examination determines if an output pin, defined in the design, is measured at an indeterminate value (step 906). When an indeterminate value for an output pin exists, a "yes" is obtained. When an indeterminate value for an output pin does not exist, a "no" is obtained.

When a "no" is obtained in step 906, process 900 skips ahead to synthesize original, and if created, all temporary design files independently (step 916). When a "yes" is obtained in step 906, create a temporary design file is performed (step 908). Addition of "unique" output values and all inputs is made to the temporary design file (step 910). For example, using FIG. 7A, this operation creates an expanded table with the new column containing "M unique" values.

Within the temporary design, for "unique" output, indicate a response value of "1" for all input combinations where an indeterminate value is measured on an original output, and indicate a response value of "0" for all input combinations where a determinate value is measured on the original output (step 912).

A determination is made as to whether additional indeterminate output pins in original design exist (step 914). When additional indeterminate output pins exist, a "yes" result is obtained. When no additional indeterminate output pins exist, a "no" result is obtained. When a "yes" result is obtained in step 914 process 900 loops back to step 908. When additional temporary design files are created, a set of temporary design files is formed. The set comprises one or more temporary design files. When a "no" is obtained in step 914, synthesize original, and if created, all temporary design files independently is performed (step 916).

A further determination is made as to whether temporary design files exist (step 918). When no temporary design files exist, a "no" response is obtained. When temporary design files exist, a "yes" response is obtained. When a "no" is obtained in step 918, process 900 skips to step 922.

When a "yes" is obtained in step 918, merge all design files by inserting multiplexors, one per "unique" output in the temporary design file, connecting "unique" outputs to a selector, "X" generator to "1" connection, the logic feeding the original output to the "0" connection, and the output of the multiplexor to the original output pin (step 920). Output final design (step 922) is performed, with process 900 terminating thereafter (step 924).

Illustrative embodiments provide a capability by which source design input containing indeterminate results or states may be resolved to a temporary, intermediate form. The intermediate form comprises a determinate value for each indeterminate instance of the source design input. The intermediate form may then be used with conventional synthesis tools to generate logic with respect to the source design input. The generated logic takes into consideration the newly-defined determinate values to produce a more effective set of rules applicable to the source design input.

Illustrative embodiments provide a capability to use standard synthesis tools, combined with additional software to programmatically create rules having indeterminate values on any outputs to be used, for example, for manufacturing test cases. The source input is provided by a predefined design, which in this example may be represented in a tabular form of a truth table or state machine. If the states defined as having a value "X," reflective of states associated with an output pin "M," could be ignored, the design could be represented using the logic generated using standard synthesis tools.

However, the "X," states, as shown in a truth table, cannot be discounted or ignored. Inability to reproduce the "X" states precludes use of standard synthesis tools until now. A modified source design is created as a temporary, intermediate design with a new output pin with a unique name for every output, which drives an "X" value. In the column for the new pin, every occurrence of an "X" value has been replaced with a "1." In the remaining instances, values were replaced with "0." The table input is then synthesized using the standard tools to generate rules.

An indeterminate state merge program is used to merge the intermediate synthesized logic and adds additional circuitry. This method therefore enables the use of standard synthesis tools to synthesize the logic, which reproduces the "X" values from the original design previously ignored in existing tools.

The flowchart and block diagrams in the figures illustrate the architecture, functionality, and operation of possible implementations of systems, methods and computer program products, according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention, the practical application, and to enable others of ordinary skill in the art to understand the invention for various embodiments, with various modifications as are suited to the particular use contemplated.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by, or in connection with, a computer or any instruction execution system. For the purposes of this description, a computer-usable or computer-readable medium can be any tangible apparatus that can contain, store, communicate, propagate, or transport the program for use by, or in connection with, the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems, remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments, with various modifications as are suited to the particular use contemplated.

What is claimed is:

1. A computer-implemented method for resolving indeterminate states by inserting logic into a design, the computer-implemented method comprising:
   receiving, by a computer, an original design input from a requester to form a received original design input;
   determining, by the computer, whether an output pin in the received original design input is measured at an indeterminate output value;
   responsive to a determination that the output pin in the received original design input is measured at an indeterminate output value, generating, by the computer, a temporary design file from the received original design input that contains all inputs and a predetermined determinate output value to replace the indeterminate output value;
   updating, by the computer, the temporary design file by generating a first predetermined replacement value of "1" for all input combinations where an indeterminate value is measured on an original output and generating a second predetermined replacement value of "0" for all input combinations where a determinate value is measured on the original output;
   synthesizing, by the computer, the received original design input and the temporary design file to form a synthesized original design input and a synthesized temporary design file;
   merging, by the computer, the synthesized original design input with the synthesized temporary design file to form a final design; and
   returning, by the computer, the final design to the requester.

2. The computer-implemented method of claim 1, wherein generating the temporary design file further comprises:
   determining, by the computer, whether additional output pins in the received original design input are measured at the indeterminate output value; and
   responsive to a determination that additional output pins in the received original design input are measured at the indeterminate output value, generating, by the computer, a different temporary design file that contains all the inputs and the predetermined determinate output value to replace the indeterminate output value for each additional output pin that measures at the indeterminate output value.

3. The computer-implemented method of claim 1, wherein generating the temporary design file creates an intermediate determinate output for each indeterminate value identified in the received original design input.

4. The computer-implemented method of claim 1, wherein merging the synthesized original design input with the synthesized temporary design file to form the final design further comprises:
  determining, by the computer, whether additional temporary design files exist; and
  responsive to a determination that additional temporary design files exist, merging, by the computer, all design files by inserting multiplexors, one per "unique" output in each temporary design file.

5. The computer-implemented method of claim 4, wherein merging all the design files by inserting the multiplexors further comprises:
  attaching, by the computer, an "X" generator to a "1" connection; and
  attaching, by the computer, logic feeding original output to a "0" connection.

6. A data processing system for resolving indeterminate states by inserting logic into a design, the data processing system comprising:
  a bus;
  a memory connected to the bus, the memory storing computer-executable instructions;
  a processor unit connected to the bus, wherein the processor unit executes the computer-executable instructions to:
    receive an original design input from a requester to form a received original design input;
    determine whether an output pin in the received original design input is measured at an indeterminate output value; generate a temporary design file from the received original design input that contains all inputs and a predetermined determinate output value to replace the indeterminate output value in response to a determination that the output pin in the received original design input is measured at an indeterminate output value;
    update the temporary design file by generating a first predetermined replacement value of "1" for all input combinations where an indeterminate value is measured on an original output and generating a second predetermined replacement value of "0" for all input combinations where a determinate value is measured on the original output;
    synthesize the received original design input and the temporary design file to form a synthesized original design input and a synthesized temporary design file;
    merge the synthesized original design input with the synthesized temporary design file to form a final design; and
    return the final design to the requester.

7. The data processing system of claim 6, wherein executing the computer-executable instructions to generate the temporary design file, the processor unit further executes computer-executable instructions to:
  determine whether additional output pins in the received original design input are measured at the indeterminate output value; and
  generate a different temporary design file that contains all the inputs and the predetermined determinate output value to replace the indeterminate output value for each additional output pin that measures at the indeterminate output in response to a determination that additional output pins in the received original design input are measured at the indeterminate output value.

8. The data processing system of claim 6, wherein executing the computer-executable instructions to generate the temporary design file, the processor unit further executes computer-executable instructions to:
  create an intermediate determinate output for each indeterminate output value identified in the received original design input.

9. The data processing system of claim 6, wherein executing the computer-executable instructions to merge the synthesized original design input with the synthesized temporary design file to form the final design, the processor unit further executes computer-executable instructions to:
  determine whether additional temporary design files exist; and
  merge all design files by inserting multiplexors, one per "unique" output in each temporary design file in response to a determination that additional temporary design files exist.

10. The data processing system of claim 9, wherein executing the computer-executable instructions to merge all the design files by inserting the multiplexors, the processor unit further executes computer-executable instructions to:
  attach an "X" generator to a "1" connection; and
  attach logic feeding original output to a "0" connection.

11. A computer program product stored on a non-transitory computer-readable storage medium having computer-executable instructions stored thereon that are executable by a computer for resolving indeterminate states by inserting logic into a design, the computer program product comprising:
  computer-executable instructions for receiving an original design input from a requester to form a received original design input;
  computer-executable instructions for determining whether an output pin in the received original design input is measured at an indeterminate output value;
  computer-executable instructions for generating a temporary design file from the received original design input that contains all inputs and a predetermined determinate output value to replace the indeterminate output value in response to a determination that the output pin in the received original design input is measured at an indeterminate output value;
  computer-executable instructions for updating the temporary design file by generating a first predetermined replacement value of "1" for all input combinations where an indeterminate value is measured on an original output and generating a second predetermined replacement value of "0" for all input combinations where a determinate value is measured on the original output;
  computer-executable instructions for synthesizing the received original design input and the temporary design file to form a synthesized original design input and a synthesized temporary design file;
  computer-executable instructions for merging the synthesized original design input with the synthesized temporary design file to form a final design; and
  computer-executable instructions for returning the final design to the requester.

12. The computer program product of claim 11, wherein computer-executable instructions for generating the temporary design file further comprises;
  computer-executable instructions for determining whether additional output pins in the received original design input are measured at the indeterminate output value; and
  computer-executable instructions for generating a different temporary design file that contains all the inputs and the predetermined determinate output value to replace the indeterminate output value for each additional output pin that measures at the indeterminate output value in response to a determination that additional output pins in the received original design input are measured at the indeterminate output value.

13. The computer program product of claim 11, wherein computer-executable instructions for generating the temporary design file further comprises:

computer-executable instructions for creating an intermediate determinate output for each indeterminate value identified in the received original design input.

14. The computer program product of claim 11, wherein computer-executable instructions for merging the synthesized original design input with the synthesized temporary design file to form the final design further comprises:

computer-executable instructions for determining whether additional temporary design files exist; and computer-executable instructions for merging all design files by inserting multiplexors, one per "unique" output in each temporary design file in response to a determination that additional temporary design files exist.

* * * * *